US010862721B2

(12) United States Patent
Siligaris et al.

(10) Patent No.: US 10,862,721 B2
(45) Date of Patent: Dec. 8, 2020

(54) CARRIER RECOVERY ANALOG SYSTEM FOR A RECEIVER OF A N-PSK SIGNAL

(71) Applicant: COMMISSARIAT A L'ENERGIE ATOMIQUE ET AUX ENERGIES ALTERNATIVES, Paris (FR)

(72) Inventors: Alexandre Siligaris, Grenoble (FR); Cedric Dehos, Douarnenez (FR); Jose-Luis Gonzalez Jimenez, Voreppe (FR); Clement Jany, Grenoble (FR); Baudouin Martineau, Grenoble (FR)

(73) Assignee: COMMISSARIAT A L'ENERGIE ATOMIQUE ET AUX ENERGIES ALTERNATIVE, Paris (FR)

( * ) Notice: Subject to any disclaimer, the term of this patent is extended or adjusted under 35 U.S.C. 154(b) by 0 days.

(21) Appl. No.: 16/531,877

(22) Filed: Aug. 5, 2019

(65) Prior Publication Data
US 2020/0044900 A1    Feb. 6, 2020

(30) Foreign Application Priority Data

Aug. 6, 2018    (FR) .................................... 18 57334

(51) Int. Cl.
*H04L 27/227*    (2006.01)
*H03L 7/081*    (2006.01)
*H03L 7/099*    (2006.01)

(52) U.S. Cl.
CPC .......... *H04L 27/2276* (2013.01); *H03L 7/081* (2013.01); *H03L 7/099* (2013.01)

(58) Field of Classification Search
CPC ............. H04L 27/2276; H04L 27/0014; H04L 27/2272; H04L 27/2271; H04L 2027/0067;
(Continued)

(56) References Cited

U.S. PATENT DOCUMENTS

| 4,641,323 A | * | 2/1987 | Tsang | .................. H04L 27/2276 329/310 |
| 6,097,768 A | * | 8/2000 | Janesch | .................. H03L 7/107 329/309 |

(Continued)

FOREIGN PATENT DOCUMENTS

EP    2 434 647 A2    3/2012

OTHER PUBLICATIONS

Preliminary French Search Report dated Jul. 5, 2019 in French Application 18 57334, filed on Aug. 6, 2018 (with English Translation of Categories of Cited Documents).
(Continued)

*Primary Examiner* — Kenneth T Lam
(74) *Attorney, Agent, or Firm* — Oblon, McClelland, Maier & Neustadt, L.L.P.

(57) ABSTRACT

A carrier recovery system for a receiver of a phase-modulated signal N-PSK, the system including a first pre-conditioning circuit of the signal received (S(t)), with the pre-conditioned signal (SP(t)) having a component, non-modulated in phase, at the frequency $Nf_c$ where $f_c$ is the carrier used for the modulation N-PSK, and a carrier regeneration circuit to regenerate two sinusoidal signals in quadrature at the frequency $f_c$, with these signals being phase locked with respect to said non-modulated component in phase of the pre-conditioned signal.

13 Claims, 10 Drawing Sheets

(58) Field of Classification Search
CPC ......... H04L 2027/0051; H04L 27/2273; H03L 7/099; H03L 7/081; H03L 7/00; H03D 7/165; H03D 1/2245; H03B 19/00; H03J 2200/11

See application file for complete search history.

(56) References Cited

U.S. PATENT DOCUMENTS

| | | | | |
|---|---|---|---|---|
| 6,891,440 | B2* | 5/2005 | Straub | H03B 27/00 327/238 |
| 2007/0160168 | A1* | 7/2007 | Beukema | H04L 27/0014 375/326 |
| 2013/0329773 | A1* | 12/2013 | Cheng | H04B 1/69 375/219 |

OTHER PUBLICATIONS

H.J. Lee et al. "High-speed and Low-power OOK CMOS Transmitter and Receiver for Wireless Chip-to-Chip Communication", Korea Advanced Institute of Science and Technology, Samsung Advanced Institute of Technology (SAIT), 3 pages.

S.J. Huang et al. "W-Band BPSK and QPSK Transceivers With Costas-Loop Carrier Recovery in 65-nm CMOS Technology", IEEE Journal of Solid-State Circuits. vol. 46, No. 12, Dec. 2011, pp. 3033-3046.

Z. He et al. "A 12 Gbps Analog QPSK baseband receiver based on Injection-locked VCO", IEEE, 2015, 3 pages.

William C. Lindsey, et al., "Carrier-tracking loops employing the phase-lock principle", Chapter 2, pp. 26-84.

William C. Lindsey, "Systems Employing the Phase-Lock or Entrainment Principle", pp. 65-129.

* cited by examiner

CARRIER RECOVERY ANALOG SYSTEM FOR A RECEIVER OF A N-PSK SIGNAL

TECHNICAL FIELD

The present invention generally applies to the field of wireless telecommunication systems and more particularly to those that offer a very high speed (several tens of Gb/s) in short-range or line of sight (LOS) conditions.

Prior Art

Wireless high-speed telecommunication systems (several Gb/s) and with a short range can be considered in many applications whether being the connection of mobile devices (smartphones, tablets, video cameras, cameras etc.) to a fixed device (PC, docking station, television, server, etc.), peer to peer communications, local networks (LAN), industrial or robotics connections (in particular in order to allow for the transmission of data between members that are in motion or that are subjected to vibrations) or the connection of cable bundles in the aeronautics or space field.

Most wireless data transmission architectures with high energy efficiency (a few pJ/bit) currently use simple modulations with low spectral efficiency (OOK modulation for example) and non-coherent receivers, based on a simple detection of power or envelope. An example of such a communication system is described in the article by H. J. Lee et al, entitled "High-speed and low-power OOK CMOS transmitter and receiver for wireless chip-to-chip communication" published in Proc. of IMWS 2015. This system theoretically makes it possible to obtain a speed of 12 Gb/s between an emitter and a receiver separated by 1 cm by using an OOK (On-Off Keying) modulation on a carrier at 80 GHz. The bandwidth is about 15 GHz and the consumption of the receiver is about 3.8 pJ/bit.

In practice, it is difficult to obtain high speeds with this type of architecture, on the one hand due to the limitation in the bandwidth and on the other hand due to the low spectral efficiency of the modulation used.

It is however possible to use modulations of a higher order (in phase, amplitude, frequency) in order to achieve higher speeds, but it is then necessary to make use of a receiver of the coherent type, i.e. a receiver of which the frequency and the phase have to be synchronised with those of the emitter. The synchronisation of the receiver is carried out by a phase locked loop (PLL). What is more, a digital signal processing circuit is generally used for receiving in order to carry out a fine synchronisation required for the demodulation of the signal. When the processing is carried out at a very high sampling frequency (for high speeds), the energy consumption of the analogue-to-digital converters and of the digital circuit then becomes substantial. Furthermore, a PLL loop consumes static power that is non-negligible. Thus the processing circuits used for the coherent demodulation of signals, for example in the standard 802.11ad (WiGiG) at 60 GHz, consumes 0.5 to 3 W for speeds from 1.9 to 3.8 Gb/s, a consumption that is much too high for most receivers that have only a low autonomy in energy.

In the case of a short-range transmission or in line of sight (LOS) conditions, the 0.5 digital processing of the signal can be simplified in that an equalising of the signal received is no longer necessary. It can then be considered to do without analogue-to-digital converters as well as the digital circuit, and to synchronise the receiver by carrying out a recovery of the carrier in the analogue domain.

A first solution for recovering the carrier from the received signal consists in using a Costas loop. There is an example of an analogue receiver using a Costas loop in the article by S J. Huang et al. entitled "W-band BPSK and QPSK transceivers with Costas-loop carrier recovery in 65-nm CMOS technology", published in IEEE Journal of Solid-State Circuits, vol. 46, No. 12, December 2011, pp. 3033-3046. Although such a receiver makes it possible to achieve speeds of a few Gb/s by using a QPSK modulation in the band W (87 GHz), on the other hand the consumption in energy of the receiver is about 50 pJ/bit, which is an order of magnitude greater than the consumption of the non-coherent receivers.

A second solution for recovering the carrier from the received signal consists in using an injection locked oscillator (ILO), as described in the article by Z. He et al. entitled "A 12 Gbps analog QPSK baseband receiver based on injection-locked VCO", published in Proc. of 2015 IEEE MTT-S International Microwave Symposium, 2015, pp. 1-4. The operating principle is the following: when a signal at the carrier frequency is directly injected into an oscillator of which the natural frequency is close to this frequency, the latter starts to oscillate by locking in frequency and in phase onto the injected signal. However, when the injected signal is a modulated signal (as is the case with the received signal), the locking is not effective and the oscillation frequency of the ILO is unstable, drifting between its natural frequency and that of the injected signal.

The purpose of the present invention is consequently to propose a coherent receiver architecture, and more particularly an analogue carrier recovery system, capable of demodulating signals that have a high modulation order and of achieving speeds of several tens of Gb/s, and this for an energy consumption comparable to that of non-coherent receivers less than 10 pJ/b.

DISCLOSURE OF THE INVENTION

The present invention is defined by a carrier recovery system for a coherent receiver, such as claimed in claim 1. Particular embodiments of this carrier recovery system are given by the dependent claims.

BRIEF DESCRIPTION OF THE DRAWINGS

Other characteristics and advantages of the invention shall appear when reading the preferred embodiment of the invention, described in reference to the accompanying figures among which.

DETAILED EXPOSURE OF PARTICULAR EMBODIMENTS

We shall consider in what follows an N-PSK signal receiver, in other words a carrier modulated by symbols that belong to a phase modulation alphabet PSK (Phase Shift Keying) of order N. The modulation alphabet is comprised by the complex symbols $$\left\{e^{j\frac{2\pi k}{N}} \mid k = 0, \ldots, N-1\right\}.$$

The general idea of the invention is to recover the carrier by means of a first step of obtaining a non-modulated harmonic of this carrier and of a second step of the injection locking of an oscillator of this harmonic. Indeed, as was seen hereinabove, the direct injection of the modulated signal (here N-PSK) leads to an unstable oscillation frequency and therefore cannot be used in practice. The invention can be used for a modulation alphabet QPSK and is particularly advantageous for high modulation orders, in particular for N≥8.

Figure 1:
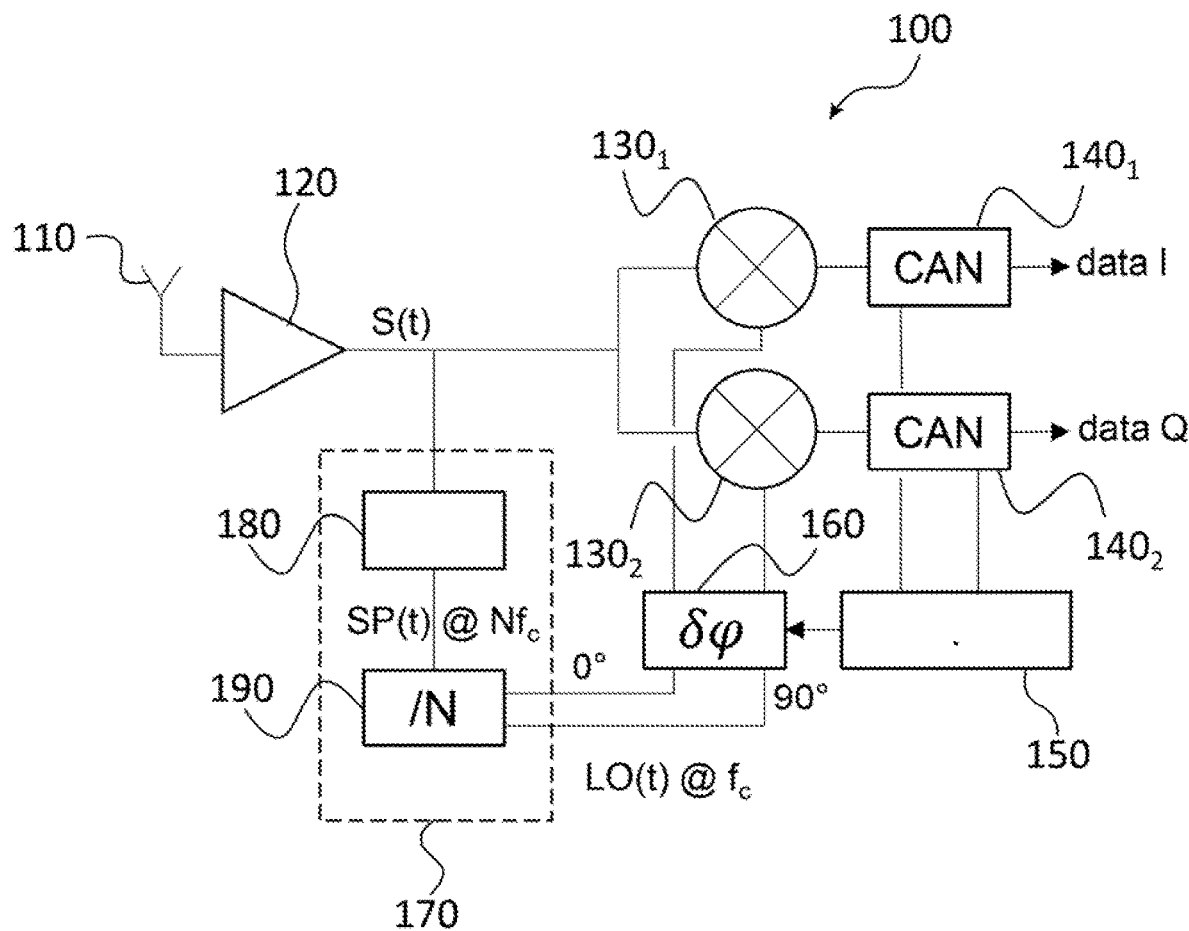
FIG. 1 diagrammatically shows the architecture of a coherent receiver that uses a carrier recovery system according to the invention.

FIG. 1 diagrammatically shows the architecture of a coherent receiver, 100, that uses a carrier recovery system according to the invention.

The signal N-PSK received by the antenna 110 is conventionally amplified by a low-noise amplifier 120 before being demodulated into baseband by two quadrature mixers $130_1$, $130_2$, with the baseband signals on the channels I and Q then being converted into digital data by the ADC converters $140_1$, $140_2$. Optionally, a phase error detector (and where applicable an amplitude error detector), 150, determines the phase difference error between the two channels in relation to the quadrature (where applicable also the gain error) and corrects this error by means of a phase shifter (where applicable, the gain error by means of an amplifier) 160, in order to provide two sinusoids in quadrature (and of the same amplitude) to the mixers. Many phase and gain correction devices for quadrature demodulator are known from prior art, for example U.S. Pat. No. 6,891,440. The object of the invention does not however relate to such a device.

The receiver, 100, further comprises a carrier recovery system 170 constituted on the one hand, by a pre-conditioning circuit, 180, intended to generate a non-modulated signal at a higher harmonic $Nf_c$ of the carrier frequency, $f_c$, using the N-PSK signal received, and on the other hand, by a carrier frequency regeneration, 190, in order to generate using this harmonic two quadrature signals, at the carrier frequency $f_c$.

The structure of the pre-conditioning circuit of the carrier recovery system shall be considered first.

Figure 2A:
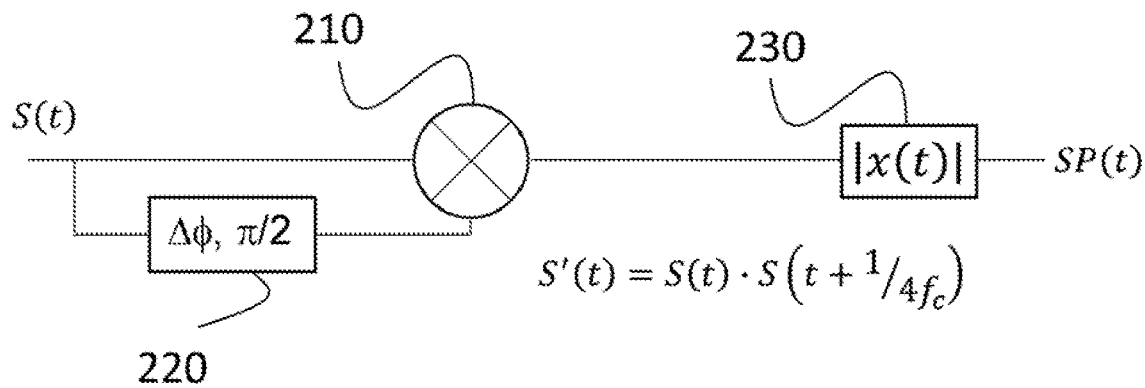
FIG. 2A diagrammatically shows a first example of a signal pre-conditioning circuit for the carrier recovery system of FIG. 1.

It is assumed in a first example that the signal received, S(t) is a QPSK signal, in other words N=4, with the corresponding pre-conditioning circuit being shown in FIG. 2A.

The signal S(t) is mixed (in other words multiplied) in the mixer 210 with a version of S(t), phase shifted 90°, at the carrier frequency $f_c$. In an equivalent manner, the signal S(t) is delayed by a quarter period of the carrier frequency, or $$1/4f_c = \frac{T_c}{4},$$

in the delay line 220 before being mixed with itself. The signal at the output of the mixer is given by:

$$S'(t) = S(t), S\left(t + \frac{1}{4f_c}\right) \quad (1)$$

This signal is then rectified by a rectifier 230, that supplies the module SP(t)=|S'(t)| at the output of the pre-conditioning circuit.

As the signal received S(t) is a modulated QPSK signal, the latter can be expressed in the form:

$$S(t)=A_I \cos(2\pi f_c t)+A_Q \sin(2\pi f_c t) \quad (2)$$

where $A_I=\pm 1$ and $A_Q=\pm 1$ are the amplitudes of the QPSK symbols (to the nearest multiplication coefficient) and therefore $(A_I)^2=(A_Q)^2=1$.

This results in that the pre-conditioned signal at the output of the rectifier is none other than:

$$SP(t) = \left|S(t), S\left(t + \frac{1}{4f_c}\right)\right| = |\cos(2\pi, 2f_c t)| \quad (3)$$

This pre-conditioned signal is therefore a rectified sinusoidal signal, of a period $$\frac{1}{4f_c}$$

Figure 2B:
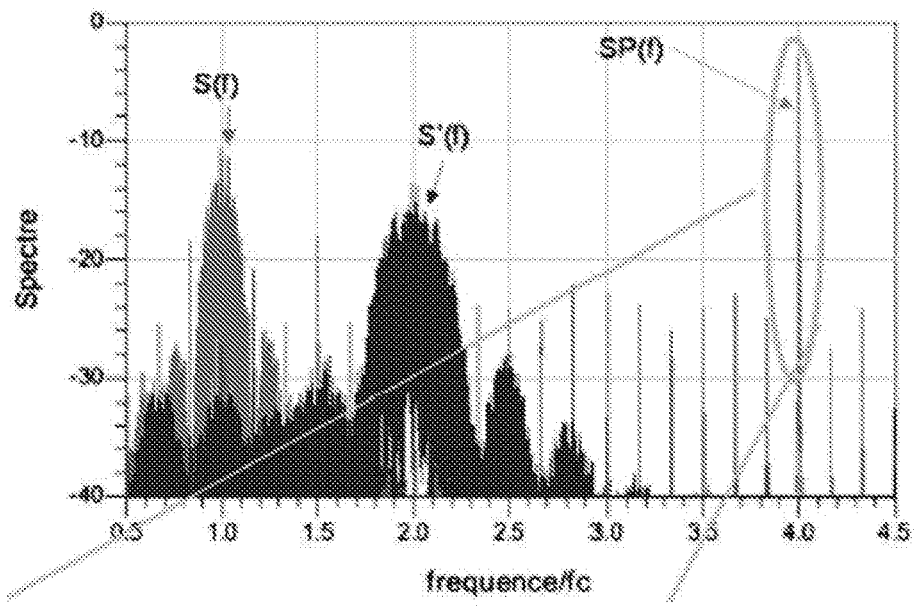
FIG. 2B shows the signal spectra at the input and at the output of the circuit of FIG. 2A.
Figure 2B:
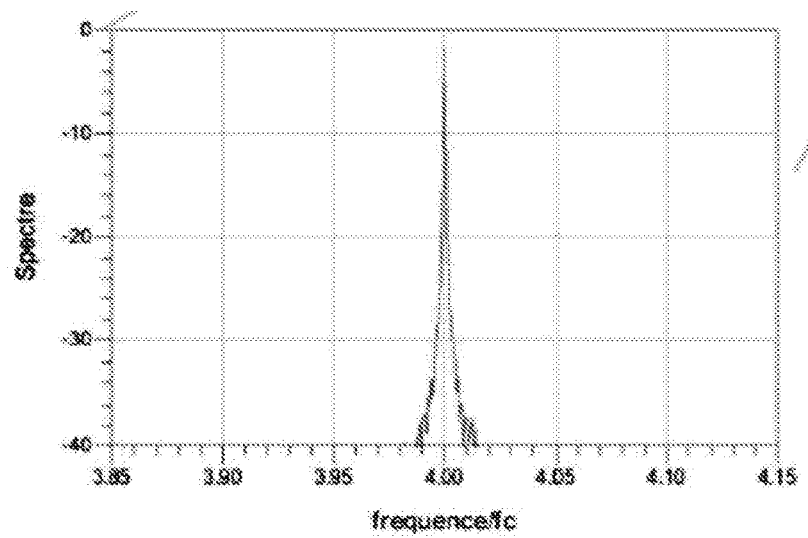

(due to the presence of the absolute value). FIG. 2B shows the respective spectra of the signals S(t), S'(t) and SP(t) where the abscissa show the frequency standardised by the carrier frequency $f_c$. Note that the pre-conditioned signal comprises, as provided, a pronounced line, centred on $4f_c$ while the QPSK signal itself does not comprise any (the modulation symbols are statistically equally distributed).

Note that the delay line 220 can in general introduce a delay of $$(2p+1)\frac{T_c}{4}$$

where p is a positive or null integer, with the change in polarity introduced when p is odd being neutralised in the rectifier.

Figure 3A:
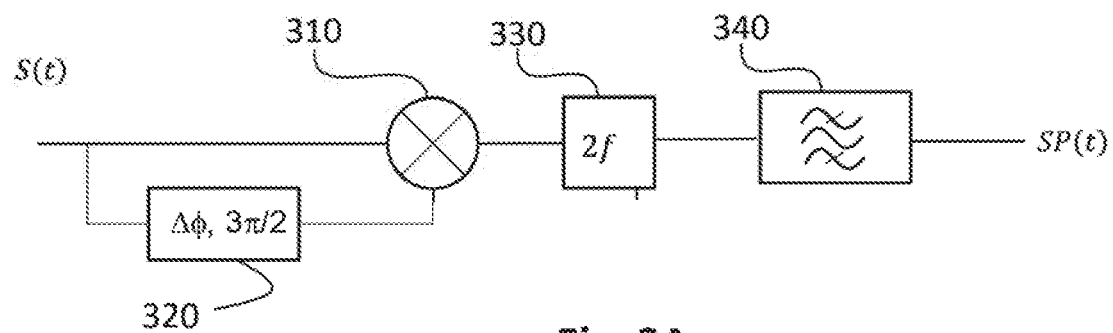
FIG. 3A diagrammatically shows a second example of a signal pre-conditioning circuit for the carrier recovery system of FIG. 1.

A second embodiment of the pre-conditioning circuit, still for a QPSK signal, is shown in FIG. 3A.

In this example, the received signal S(t) is delayed in the delay line 320 by $$\frac{3T_c}{4}$$

or more generally by $$(2p+1)\frac{T_c}{4}$$

where p is a positive odd integer. In other words, the spectral component of the signal at $f_c$ is phase shifted by $$(2p+1)\frac{\pi}{2}.$$

The signal thus delayed is mixed with itself in the mixer 310 and the result at the output of the mixer is supplied to a frequency doubler, 330, followed by band-pass filter, 340, around the frequency $4f_c$. This filter preferably has a high quality factor in such a way as to allow to pass substantially only the component at $4f_c$.

Figure 3B:
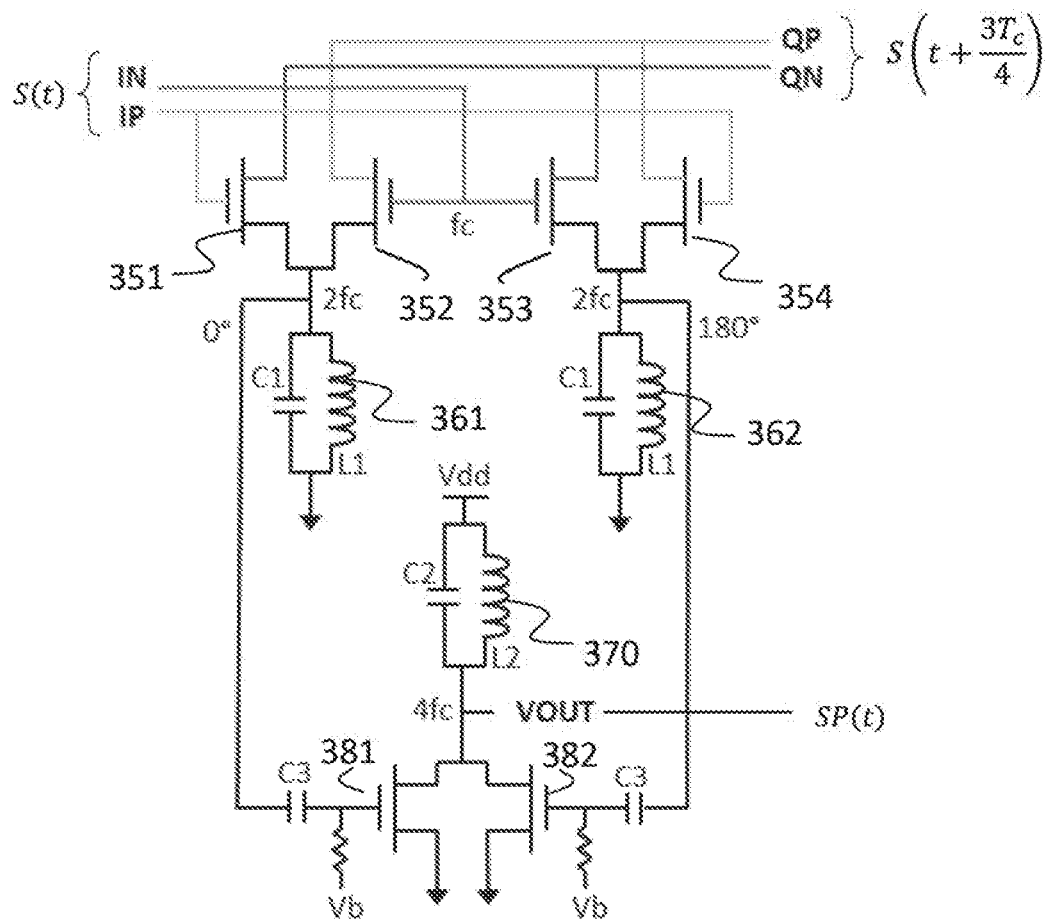
FIG. 3B shows an implementation in differential mode of the pre-conditioning circuit of FIG. 3A.

This pre-conditioning circuit can be implemented in differential mode as shown in FIG. 3B.

The signal S(t) is supplied in differential on the gates of a first pair of mixing transistors, 351, 352, and of a second pair of mixing transistors 353, 354. These transistors all have the same characteristics and consequently the pairs of transistors are balanced.

The delayed signal, $$S\left(t+\frac{3T_c}{4}\right),$$

supplies in differential the drains of the first pair of mixing transistors and of the second pair of the mixing transistor.

A first oscillating circuit, 361, at the double harmonic frequency, $2f_c$, is mounted between a first common terminal that connects the sources of the transistors 351, 352 and the mass. Similarly, a second oscillating circuit, 362, at the double harmonic frequency, $2f_c$, is mounted between a second common terminal that connects the sources of the transistors 353, 354 and the mass. The transistors 351-354 play the role of the mixer 310 in FIG. 3A. Advantageously, the filters 361 and 362 select the double harmonics.

The mixing signals present at the first common terminal and at the second common terminal drive in differential, via the decoupling capacitors C3, the gates of a third pair of balanced transistors, 381,382 of which the drains are connected to a third common terminal. A third oscillating circuit, 370, at the harmonic frequency $4f_c$ is mounted between this third common terminal and the power supply. The third pair of transistors plays the role of a frequency doubler, 330 and the third oscillating circuit plays the role of a band-pass filter with a high quality factor, 340, of FIG. 3A.

The output signal present at the third common terminal is the pre-conditioned signal, SP(t), at the harmonic frequency, $4f_c$, with the QPSK modulation removed.

Figure 4:
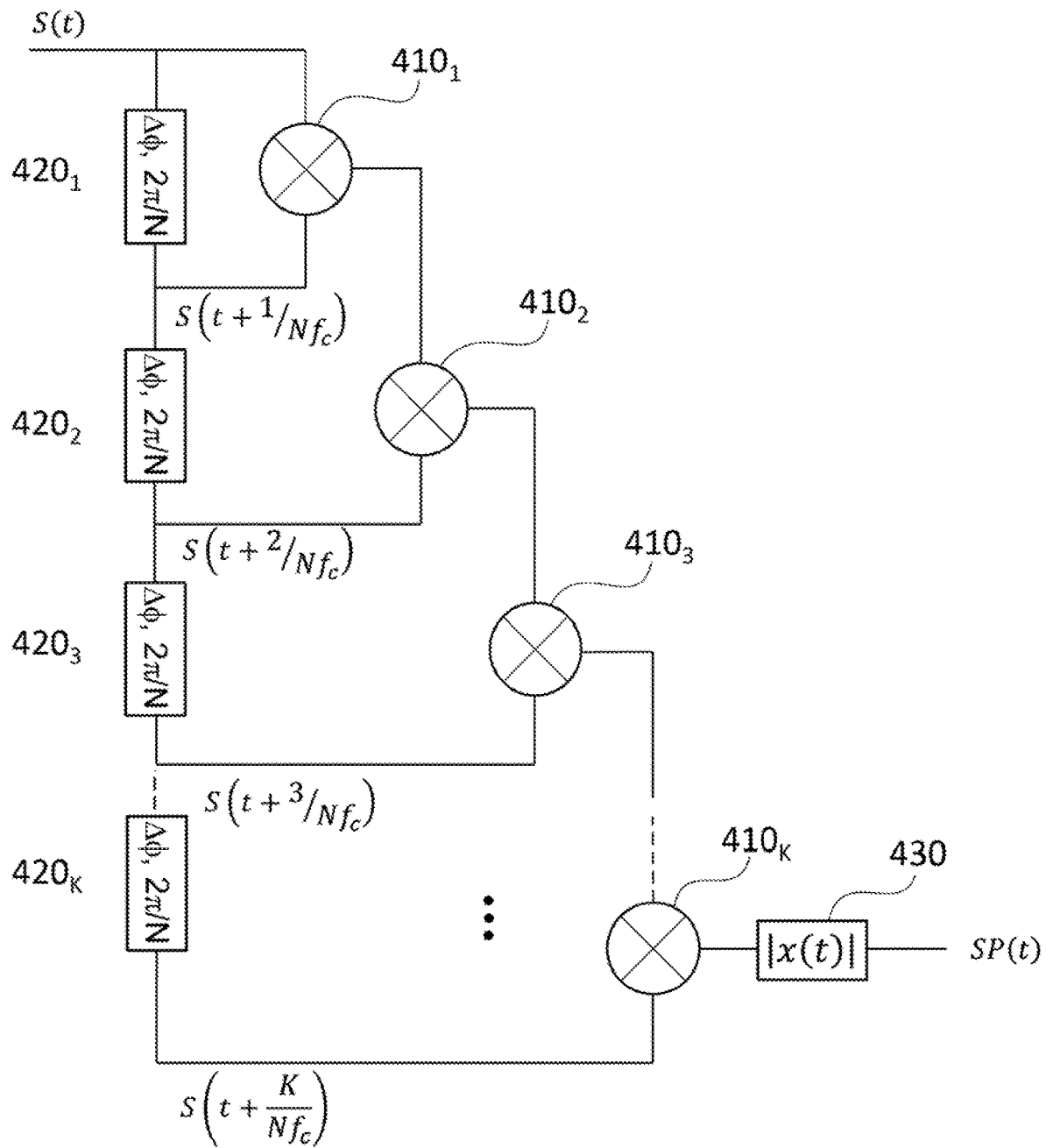
FIG. 4 diagrammatically shows a signal pre-conditioning circuit for a carrier recovery system according to a first embodiment of the invention.

More generally, FIG. 4 shows a signal pre-conditioning circuit for a carrier recovery system, according to a first embodiment of the invention, when the signal received is a signal N-PSK.

The pre-conditioning circuit comprises a battery of $$K=\frac{N}{2}-1$$

(where N is an even value) mixers in cascade, 410$_1$, ..., 410$_K$, and a series of K associated delay lines, 420$_1$, ..., 420$_K$, each delay line, 420$_K$, introducing an elementary delay of $$\frac{T_c}{N}$$

that represents a fraction $$\frac{1}{N}$$

of the period of the carrier. In other terms, each delay line, 420$_K$, can be considered as a phase shifter introducing an elementary phase shift of $$\frac{2\pi}{N}$$

at the frequency $f_c$. The output signal of a delay line is supplied on the one hand to the input of the following delay line in the series and on the other hand to an input of the associated mixture, 410$_k$, of the same stage k.

The first delay line 420$_1$ directly receives the signal S(t) as input of the pre-conditioning circuit.

Each mixer 410$_k$ carries out a multiplication between the output of the preceding mixer 410$_{k-1}$ and the output of the k$^{th}$ delay line of the series, 420$_k$.

The output of the last mixer, 410$_K$, is connected to the input of the rectifier, 430.

The pre-conditioned signal SP(t) at the output of the circuit of the rectifier is expressed ultimately in the form:

$$SP(t)=\left|\prod_{k=0}^{\frac{N}{2}-1} S\left(t+\frac{k}{Nf_c}\right)\right| \quad (4)$$

It should be noted, as hereinabove, that each delay line can introduce more generally a delay of $$(2p+1)\frac{T_c}{4}$$

where p is a positive or null integer number, when the possible change in polarity at the output of the last mixer is neutralised by the rectifier.

Figure 5:
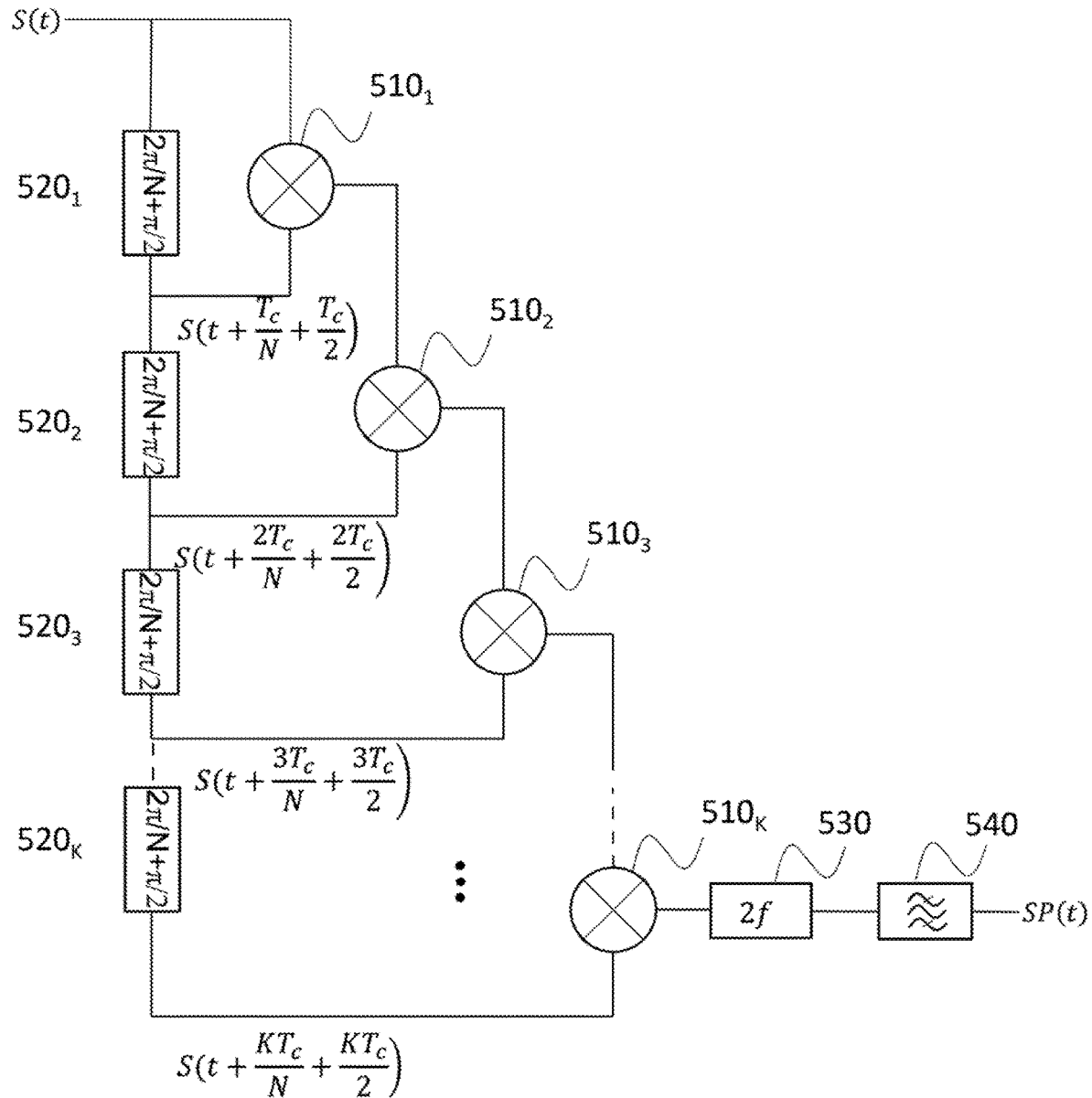
FIG. 5 diagrammatically shows a signal pre-conditioning circuit for a carrier recovery system according to a second embodiment of the invention.

FIG. 5 shows a signal pre-conditioning circuit for a carrier recovery system, according to a second embodiment of the invention, when the received signal is an N-PSK signal.

The pre-conditioning circuit comprises a battery of $$K = \frac{N}{2} - 1$$

(where N is an even value) mixers in cascade, $510_1, \ldots, 510_K$, and a series of K associated delay lines, $520_1, \ldots, 520_K$, with each delay line, $520_k$, k=1, ..., K introducing the same elementary delay of $$\frac{T_c}{N} + \frac{T_c}{2}.$$

The signal at the output of a delay line $520_k$, k=1, ..., K is supplied on the one hand to the input of the following delay line in the series and on the other hand to an input o the associated mixer, $510_k$, of the same stage k.

The signal at the output of the last stage, i.e. of the mixer $510_K$, is supplied to the frequency doubler 530 then to the band-pass filter with a high quality factor, 540, centred on the frequency $Nf_c$.

As indicated hereinabove, the various elementary delays are defined to the nearest odd multiple of $$\frac{T_c}{2}.$$

The structure of the mixers $510_1, \ldots, 510_K$ can be similar to the mixing stage shown in the top portion in FIG. 3B. The input signal IN,IP of a mixer $510_k$ driving the gates of the transistors of the first and second pairs of transistors is the one at the input of the stage k and the one feeding the drains of these transistors is the one at the output of the delay line $520_k$. The first and second oscillating circuits of the mixer $510_k$ select the harmonics at the frequency $kf_c$ (resonance at $kf_c$), The signals present on the first and second common terminals represent the output signal of the mixer $510_k$. The last mixer $510_K$ is associated with a frequency doubler and a third oscillating circuit as shown in FIG. 3B, with the third oscillating circuit here intended to filter the harmonics of frequency $Nf_c$ (resonance at $Nf_c$).

As described hereinabove in relation with FIGS. 4 and 5, the signal pre-conditioning circuit applies to the result of the multiplication of the various delayed signals, either a rectification (430), or a frequency doubling (530). More generally, those skilled in the art will understand that it is possible to apply a quadratic function (or equivalently a non-linearity of order 2) to the result of said multiplication for the purpose of obtaining the same result.

The carrier regeneration circuit shall now be described hereinafter.

Figure 6A:
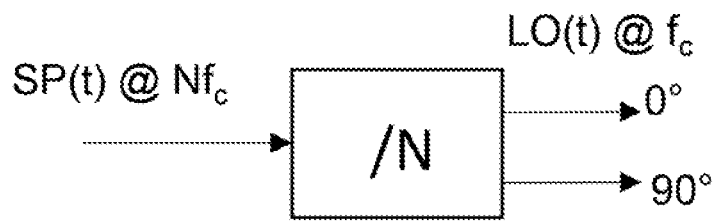
FIGS. 6A-6D diagrammatically show various alternatives of the carrier regeneration circuit for the carrier recovery system according to FIG. 1.

According to a first alternative, shown in FIG. 6A, the carrier regeneration circuit can be a simple N-rank frequency divider, able to provide two quadrature sinusoidal signals at the frequency $f_c$. For very high frequencies, of about several tens of GHz, an injection locked frequency divider (ILFD) will advantageously be used followed by one or several frequency dividers using a current switching logic or CML (Current Mode Logic) and/or conventional frequency dividers with a base of CMOS flip-flops. The frequency dividers CML can be used up to frequencies of about 30 GHz and those based on CMOS flip-flops up to a few GHz. Thus, a first division rank can be carried out using an ILFD divider, a second by a CML divider and a third, if needed, by a CMOS divider, with the understanding that the product of the successive division factors is chosen equal to N.

Figure 6B:
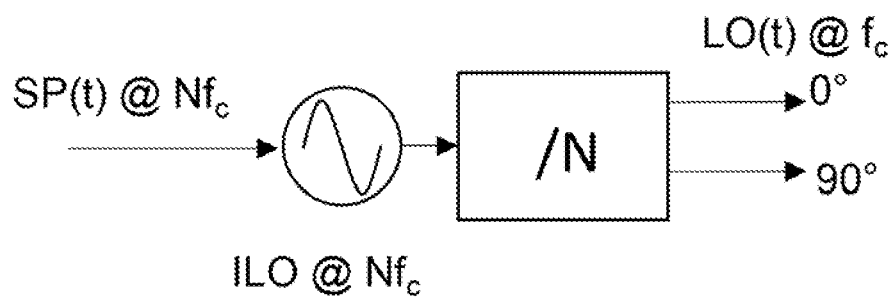
Figure 6C:
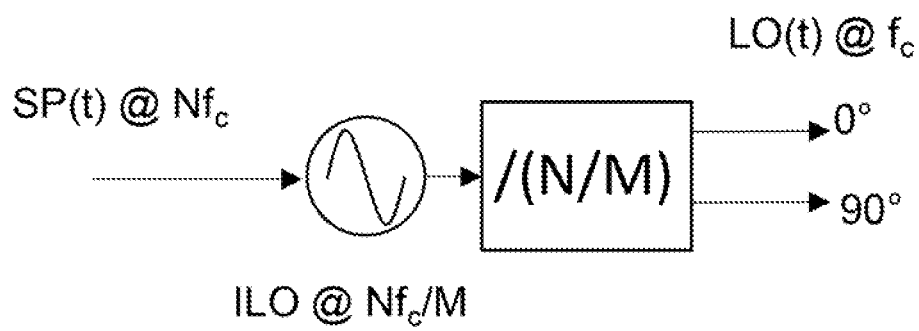
Figure 6D:
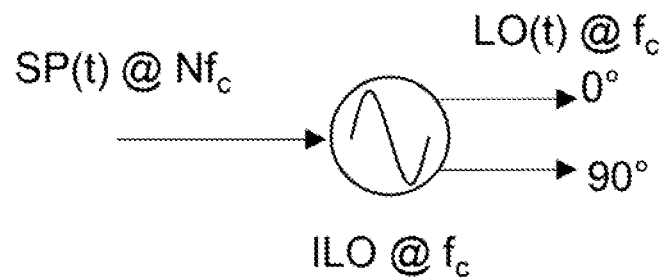

According to a second alternative, shown in the example in FIGS. 6B to 6D, the carrier regeneration circuit is carried out using an injection locked oscillator (ILO) of the pre-conditioned signal, SP(t).

In the example of FIG. 6B, the pre-conditioned signal SP(t) is injected into the oscillator ILO. The phase locking of the oscillator onto the $N^{th}$ harmonic results in a rejection of the portions of the spectrum that contain a phase modulation and the regenerating of a non-modulated signal, purely sinusoidal at the frequency $Nf_c$. This signal is then frequency divided by a factor N in order to produce two quadrature signals as described hereinabove in relation with FIG. 6A.

In the example of FIG. 6C, the pre-conditioned signal SP(t) is injected into the ILO oscillator and the latter freely oscillates at a frequency $Nf_c/M$ where M is an N-integer divider, by phase locking onto the component at $Nf_c$ of the injected signal. Thus, the ILO oscillator acts as an ILFD frequency divider. It carries out both the rejecting of the phase-modulated portions of the spectrum and a first frequency division, by a factor M. The oscillator is followed by a conventional frequency divider, for example with CMOS flip-flops, in order to carry out a division by the remaining factor N/M and thus regenerate the carrier.

Finally, in the example of FIG. 6D, the pre-conditioned signal SP(t) is injected into the ILO oscillator and the latter freely oscillates at the frequency $f_c$ by phase locking onto the component at $Nf_c$ of the injected signal. The oscillator acts as an ILFD frequency divider of factor N and the quadrature signals at the frequency $f_c$ are directly supplied by the oscillator without it being necessary to provide an additional division stage.

Figure 7:
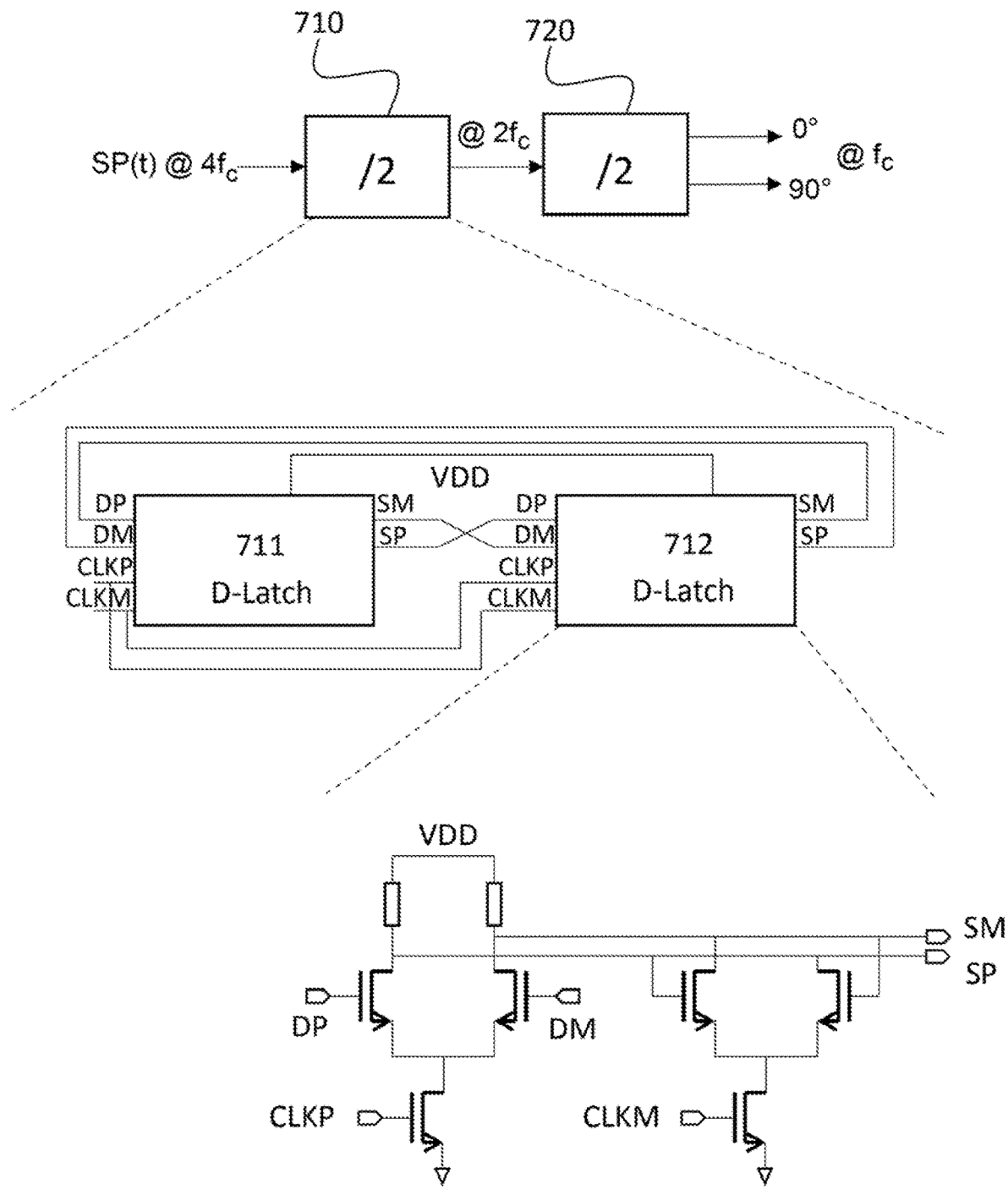
FIG. 7 diagrammatically shows a first example of an implementation of the carrier regeneration circuit.

FIG. 7 diagrammatically shows a first example of implementation of the carrier regeneration circuit.

This circuit is compliant with the first alternative described hereinabove in relation with FIG. 6A. In the present case, this is a frequency divider by a factor 4, adapted consequently to a carrier recovery system for a QPSK signal. The regeneration circuit is formed from two divide-by-2 frequency dividers, 710 and 720, mounted in cascade. Each divide-by-2 frequency divider is carried out in CML logic, by means of two flip-flops 711 and 712, mounted in a loop, with the data output from one (SM, SP) being crossed in order to provide the data input (DM, DP) of the other, with the clock signals of one flip-flop (CKP, CKM) also being inverted in relation to the clock signals of the other. The details of a flip-flop are shown at the bottom of the figure, with the left portion (master) comprising a pair of transistors (sample and hold) controlling the left portion (slave), in a manner known per se.

The pre-conditioned signal SP(t) is used in differential mode as a clock signal (CKM, CKP) of the first flip-flop, 711, of the first divide-by-2 frequency divider and the signal at the carrier frequency is supplied by the second flip-flop (not shown) of the second divide-by-2 frequency divider, 720. In practice, in order to generate the two quadrature signals, two second divide-by-2 frequency dividers will be used, receiving the outputs SM, SP of the first divide-by-2 divider, with the inputs of the two second dividers being crossed between them.

Figure 8A:
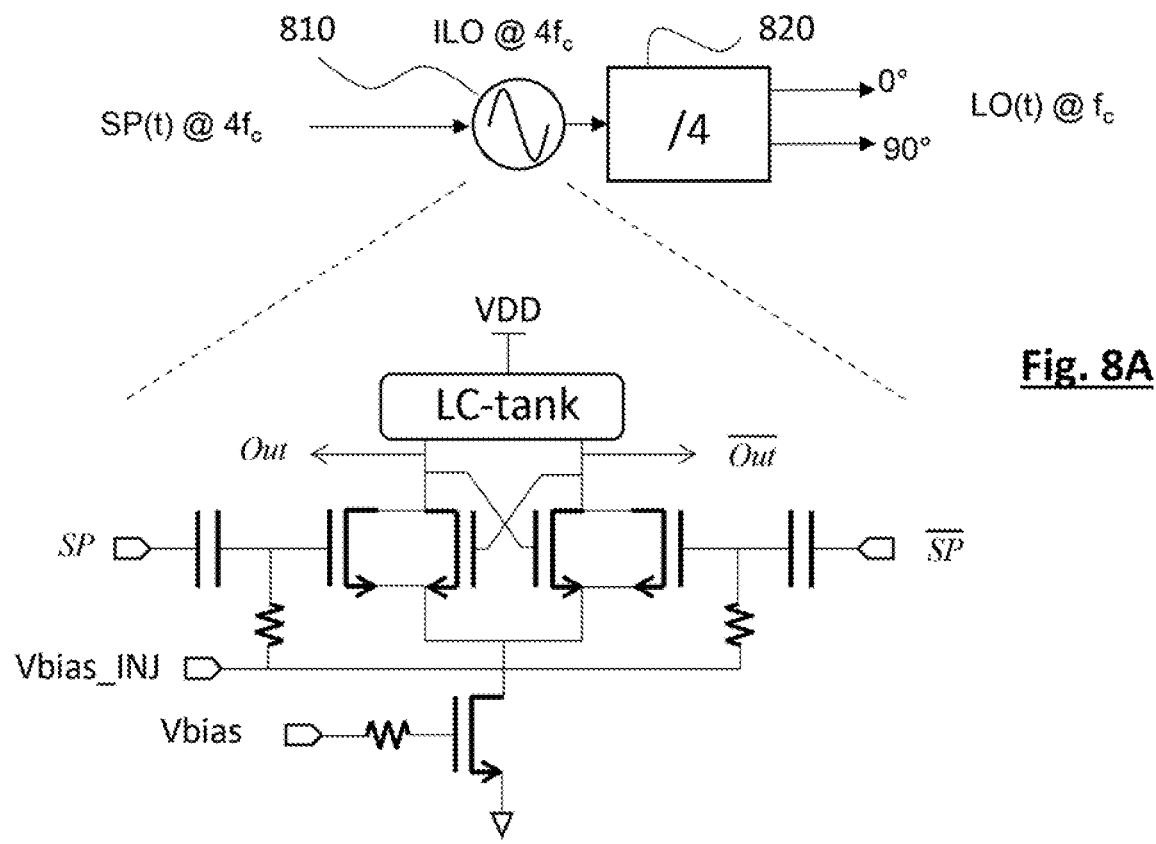
FIG. 8A diagrammatically shows a second example of an implementation of the carrier regeneration circuit.

FIG. 8A diagrammatically shows a second example of implementation of the carrier regeneration circuit for a QPSK signal.

This circuit is compliant with the second alternative described hereinabove, in relation with FIG. 6B. It comprises an injection locked oscillator (ILO), 810, operating around the frequency $4f_c$ and locked onto the line $4f_c$ of the pre-conditioned signal, SP(t). In other words, the frequency $4f_c$ is in the lock-in range of the ILO oscillator. It regenerates the line at $4f_c$ of the signal SP(t) as well as the phase noise around this line) and rejects the residual portions of the spectrum corresponding to the phase modulation. The structure of the ILO oscillator, 810, is detailed at the bottom of the figure. It is based on a differential cross-pair oscillator that uses a resonant circuit LC (LC-tank). The signal SP(t) is injected in differential into the oscillator. The latter locks onto the line with the highest power located in its lock-in range, namely the line at $4f_c$ the signal SP(t). The signal differential at the output (Out,$\overline{\text{Out}}$) copies this line. It is then divided by a frequency divider by a factor 4, 820, such as for example the CML logic divider of FIG. 7.

Figure 8B:
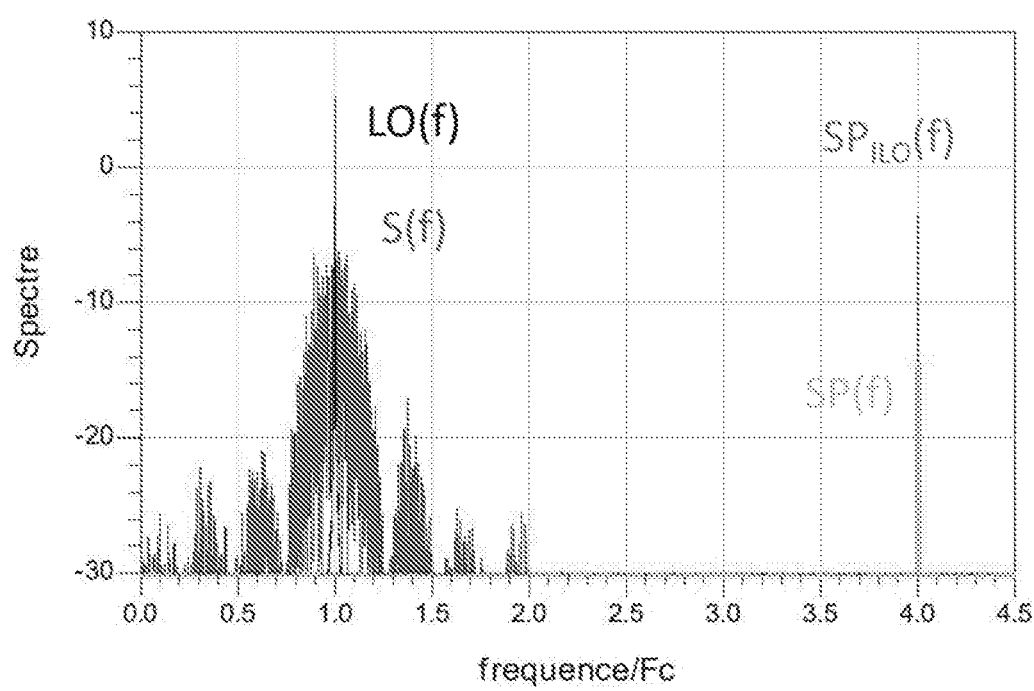
FIG. 8B shows the signal spectrum in various points of the carrier regeneration circuit of FIG. 8A.

FIG. 8B shows the spectrum of signals intervening in the carrier regeneration circuit of FIG. 8A. Represented first is the spectrum S(f) of the signal QPSK received. This spectrum is relatively spread out due to the phase modulation. The signal received is pre-conditioned by a pre-conditioning circuit as shown in FIG. 4 or 5 (with N=4) for supplying a pre-conditioned signal of which the spectrum SP(f) is also shown in FIG. 8B. As has been seen, this spectrum comprises a very pronounced line, centred on $4f_c$ (with a phase noise around it), onto which the ILO oscillator locks. The signal at the output of the ILO oscillator, 810, designated by $SP_{ILO}(f)$, has the form of an intense line and strong signal-to-noise ratio. The frequency of this signal is divided by a factor 4 in the frequency divider 820 in order to give a recovered carrier signal, of which the spectrum is represented by LO(f). It can be used directly in the demodulation stage into baseband of the receiver 100.

Figure 9A:
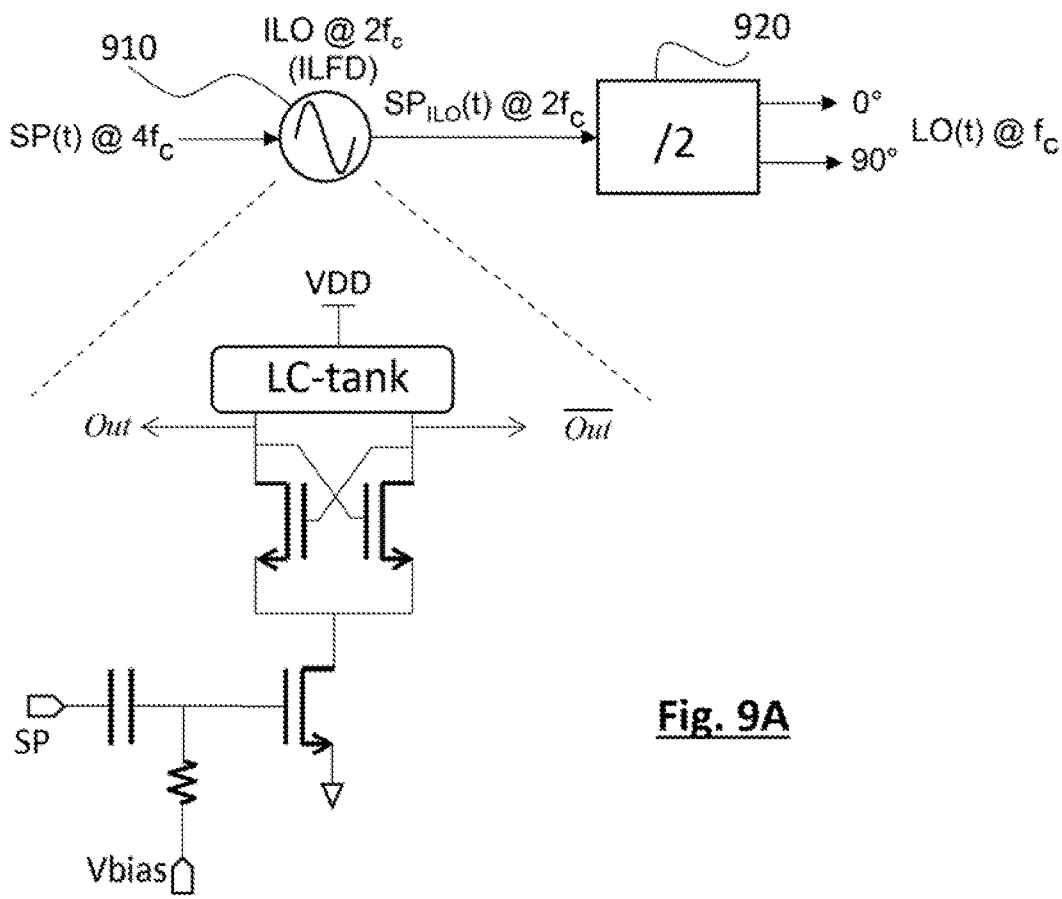
FIG. 9A diagrammatically shows a third example of an implementation of the carrier regeneration circuit.

FIG. 9A diagrammatically shows a third example of implementation of the carrier regeneration circuit for a QPSK signal.

This circuit is compliant with the second alternative described hereinabove, in relation with FIG. 6C. It comprises an oscillator (ILO) 910, operating around the frequency $2f_c$. It is based on a differential cross-pair oscillator that uses a resonant circuit LC (LC-tank) and injection locked onto its common mode (as push-push), by means of the pre-conditioned signal, SP(t), as shown in the lower portion of the figure.

Figure 9B:
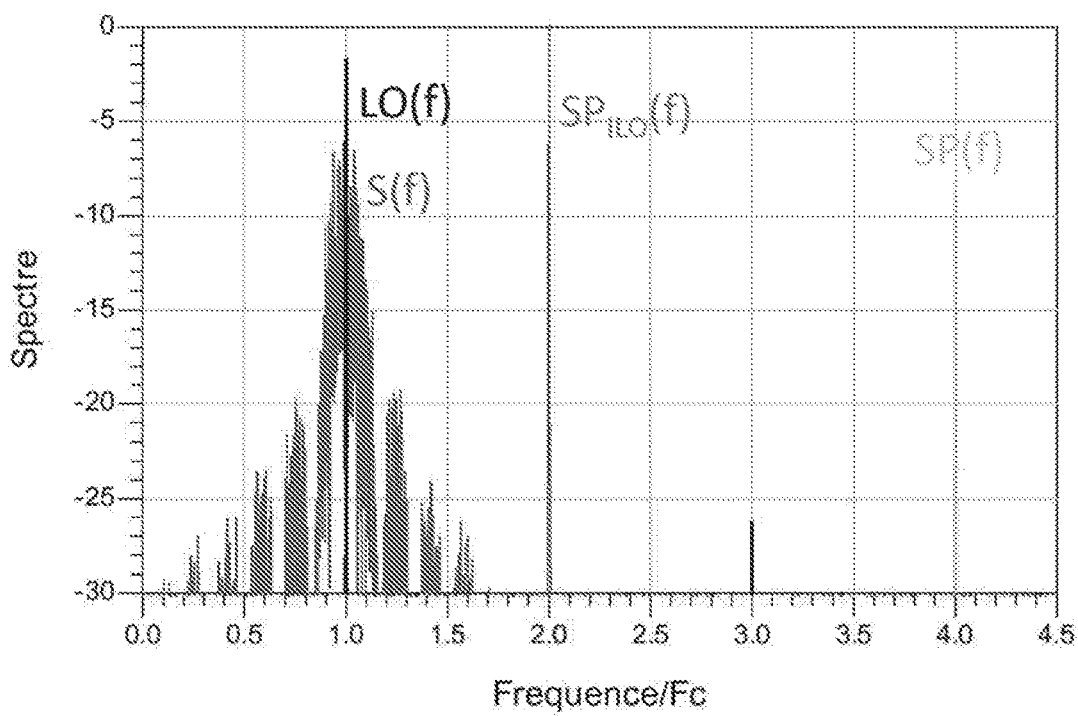
FIG. 9B shows the signal spectrum at various points of the carrier regeneration circuit of FIG. 9A.

The ILO oscillator oscillates at the frequency $2f_c$ and is phase locked onto the component at $4f_c$ of the signal SP(t), shown in FIG. 9B, with the rest of the spectrum corresponding to a phase-modulated residual signal, being rejected. It thus acts as a first injection locked frequency divider (ILFD), regenerating both the line of the signal at $4f_c$ of SP(t) and dividing its frequency by 2. The signal at the output of the oscillator, of spectrum $SP_{ILO}(f)$, is then divided in frequency by a factor 2, for example by means of a divider with CML logic of FIG. 7, in order to provide the recovered carrier signal, of which the spectrum, LO(f) was also shown in FIG. 9B.

Figure 10A:
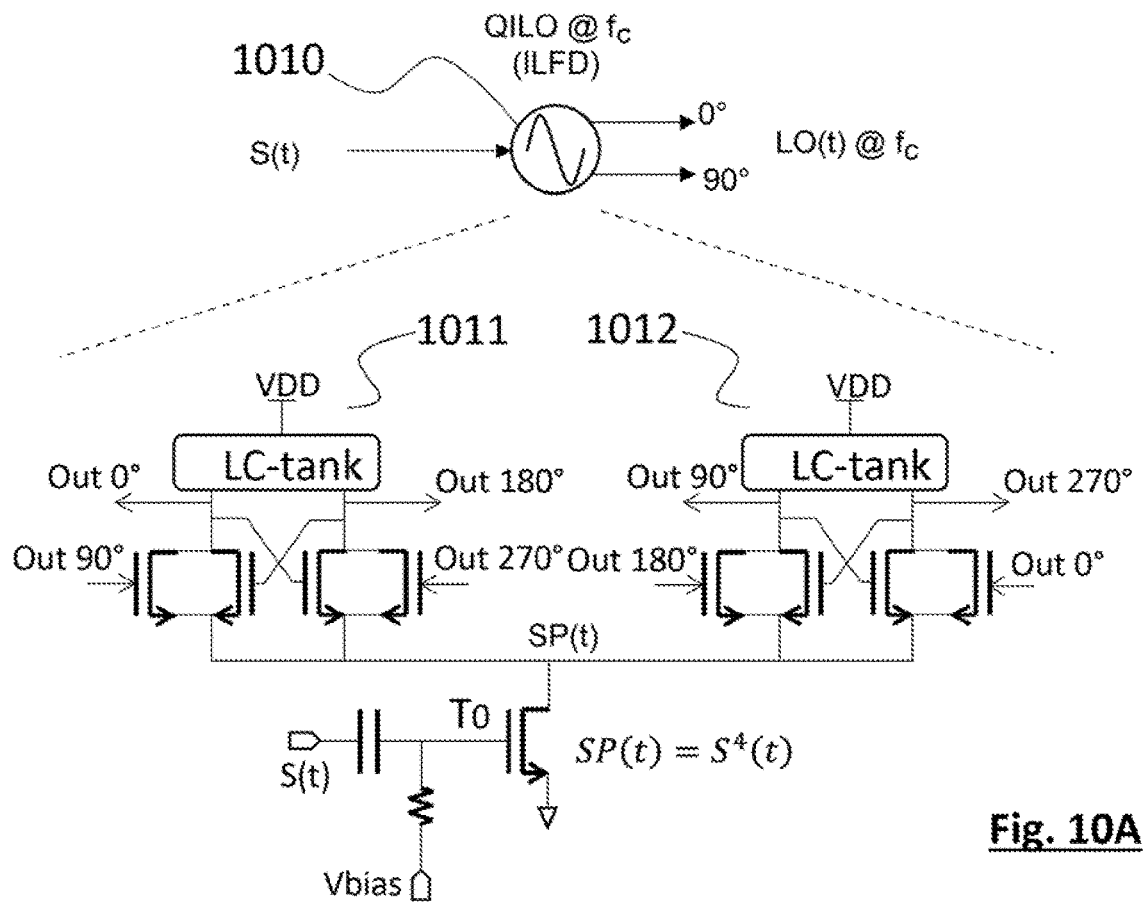
FIG. 10A diagrammatically shows an example of an implementation of the carrier recovery system.

FIG. 10A diagrammatically shows an example of implementation of the carrier recovery system for a QPSK signal.

This circuit is compliant with the second alternative described hereinabove, in relation with FIG. 6D. It comprises an injection locked oscillating circuit (ILO), 1010, receiving this time directly the modulated QPSK signal, S(t). This signal is pre-conditioned in the oscillating circuit itself as indicated at the bottom of the figure. Advantage is taken here of the fact that the MOS transistor, $T_0$, is polarised (by $V_{bias}$) in such a way as to operate in a non-linear regime, in other words the characteristic $I_{DS}=f(V_{GS})$ is made use of in a non-linear zone, which gives rise to current contributions in $S^2(t)$, $S^3(t)$, $S^4(t)$, ... which correspond to Taylor's expansion of the function $f$. The contributions in S(t), $S^2(t)$, $S^3(t)$, are phase modulated while, for a QPSK signal, the contribution in $S^4(t)$ has a non-modulated component at $4f_c$. Furthermore, this non-modulated component is of stronger power (that at $8f_c$ is of lower power). Ultimately, it is understood that the injection transistor $T_0$ with its polarisation circuit at $V_{bias}$ lays the role of a pre-conditioning circuit. The transistor $T_0$ receives on its gate the phase-modulated signal S(t) after suppression of its DC component by a connecting capacitor.

The oscillating circuit further comprises a carrier regeneration circuit formed by two quadrature differential cross-pair oscillators, 1011, 1012, that use resonant circuits LC (LC-tank), of which the resonance frequency is close to $f_c$. The quadrature oscillators are current injection locked in common mode (in 4-push mode, i.e. injection is done 4 times per period of the oscillator ILO), on the line with the most power at $4f_c$, present in the pre-conditioned signal SP(t). The output signals $Out_{0°}$,$Out_{180°}$, on the one hand, and $Out_{90°}$,$Out_{270°}$ on the other hand, are provided in differential to the quadrature mixers of the baseband demodulator.

Figure 10B:
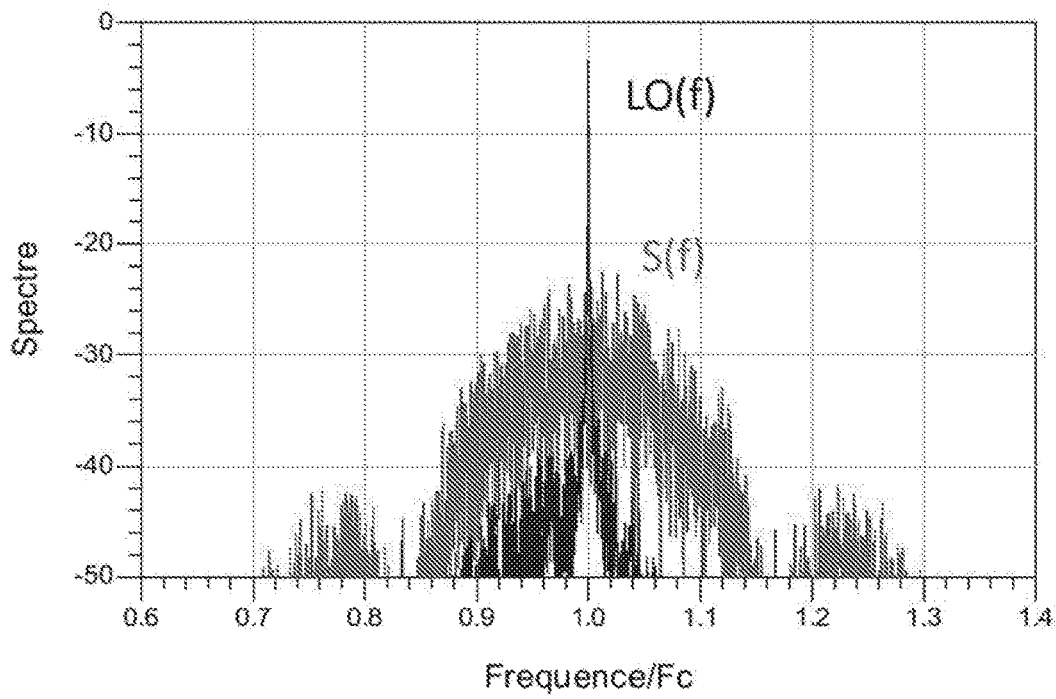
FIG. 10B shows the signal spectrum at various points of the carrier recovery system of FIG. 10A.

FIG. 10B shows the spectrum of the received signal, S(t), injected into the oscillating circuit and that of the signal at the carrier frequency LO(f) (i.e. the spectrum of $Out_{0°}$-$Out_{180°}$ or $Out_{90°}$-$Out_{270°}$).

Those skilled in the art will understand that the example of implementation of the carrier recovery system shown in FIGS. 10A-10B is particularly compact and effective.

Note that the carrier recovery system according to the present invention is carried out entirely in analogue and therefore makes it possible to advantageously do without digital processing devices of the signal.

The carrier recovery system according to the invention has application in particular in the context of high-speed and short-range communications that require only a low energy consumption. It makes it possible for example to effectively replace the cables and connectors between fixed or mobile devices (for example in the industrial environment). It also makes it possible to produce smartphones, tablets, phablets, entirely hermetic by totally suppressing the conventional USB connectors and by carrying out the recharging via induction. Finally, it can be applied to communication connections over a longer distance, for which the reduction in consumption on the receiver is essential, such as for example in the field of the Internet of Things (IoT).

The invention claimed is:

1. A carrier recovery system for coherent receiver to receive a phase-modulated signal, S(t), by an N-PSK modulation of a carrier where N is an even number, the carrier recovery system comprising:

a signal pre-conditioning circuit for supplying a pre-conditioned signal having a non-modulated component with a harmonic $Nf_c$ of a carrier frequency $f_c$, said non-modulated component at $Nf_c$ being obtained by multiplication of the phase-modulated signal and of $$K = \frac{N}{2} - 1$$

delayed versions of the signal by respective delays $$k\frac{T_c}{N},$$

with k=1, ..., K, each delay being defined to a nearest integer multiple of $$\frac{T_c}{2},$$

where $T_c=1/f_c$, with a result of said multiplication being subjected to a quadratic function; and a carrier regeneration circuit for generating a sinusoidal signal at the carrier frequency phase locking onto said harmonic.

2. The carrier recovery system according to claim 1, wherein the signal pre-conditioning circuit obtains the pre-conditioned signal by $$SP(t) = \left| \prod_{k=0}^{\frac{N}{2}-1} S\left(t + \frac{kT_c}{N}\right) \right|.$$

3. The carrier recovery system according to claim 2, wherein the signal pre-conditioning circuit comprises a plurality K of stages, with each stage (k) comprising a delay ($420_k$) of value $$\frac{T_c}{N},$$

and a mixer ($410_k$), with a mixer of a current stage (k) multiplying a signal supplied by a mixer ($410_{k-1}$) of a preceding stage (k−1) with a signal at an output of a delay ($420_{k-1}$) of the preceding stage, after having delayed it by the delay ($420_{k-1}$) of the current stage (k), with a first stage receiving said phase-modulated signal, with a signal at an output of a mixer of a last stage ($410_K$) being rectified by a rectifier in order to supply the pre-conditioned signal (SP(t)).

4. The carrier recovery system according to claim 2, wherein the signal pre-conditioning circuit comprises a plurality K of stages, with each stage (k) comprising a delay ($520_k$) of value $$\frac{T_c}{N} + \frac{T_c}{2},$$

and a mixer ($510_k$), with a mixer of a current stage (k) multiplying a signal supplied by the mixer ($510_{k-1}$) of a preceding stage (k−1) with a signal at an output of a delay ($520_{k-1}$) from the preceding stage, after having delayed it by the delay ($520_k$) of the current stage (k), with a first stage receiving said phase-modulated signal, with a signal at an output of a mixer of a last stage ($510_K$) being supplied to a frequency doubling circuit, followed by a band-pass filter that only allows said harmonic $Nf_c$ to pass in order to supply the pre-conditioned signal, SP(t).

5. The carrier recovery system according to claim 2, wherein each mixer of a current stage (k) comprises a first pair of transistors and a second pair of transistors, with gates of the transistors of the first pair and gates of transistors of the second pair receiving in differential an output signal of a mixer of a preceding stage (k−1), with drains of the transistors of the first pair and drains of the transistors of the second pair receiving in differential a signal at an output of a delay ($520_k$) of the current stage (k), an output signal of the current stage being supplied in differential by a signal on a first common terminal of sources of the transistors of the first pair and a signal on a second common terminal of sources of the transistors of the second pair.

6. The carrier recovery system according to claim 2, wherein each mixer of a current stage k=1,...,K comprises a first oscillating circuit between a first common terminal and a mass and a second oscillating circuit between a second common terminal and a mass, with the first oscillating circuit and the second oscillating circuit allowing to pass only the harmonic at the frequency $kf_c$.

7. The carrier recovery system according to claim 1, wherein the carrier regeneration circuit is a frequency divider by a factor N.

8. The carrier recovery system according to claim 7, further comprising an injection locked frequency divider followed by at least one frequency divider using a current switching logic CML and/or at least one frequency divider with a base of CMOS flip-flops, with a product of frequency division factors of the dividers being equal to N.

9. The carrier recovery system according to claim 1, wherein the carrier regeneration circuit comprises an injection locked oscillator operating at the frequency $Nf_c$, followed by a frequency divider by a factor N, an oscillator phase locking onto said non-modulated component at $Nf_c$ of the pre-conditioned signal and supplying a purely sinusoidal signal at the frequency $Nf_c$, with the frequency divider dividing the frequency of the purely sinusoidal signal by a factor N in order to regenerate the carrier.

10. The carrier recovery system according to claim 1, wherein the carrier regeneration circuit comprises an injection locked oscillator operating at a frequency $$\frac{N}{M}f_c,$$

where M is an N-integer divider, followed by a frequency divider by a factor $$\frac{N}{M},$$

with the injection locked oscillator locking in phase and in frequency on said non-modulated component at $Nf_c$ of the pre-conditioned signal and supplying a purely sinusoidal signal at the frequency $$\frac{N}{M}f_c,$$

with the frequency divider dividing the frequency of the purely sinusoidal signal of a factor $$\frac{N}{M}$$

in order to regenerate the carrier.

11. The carrier recovery system according to claim 10, wherein the phase-modulated signal is a QPSK signal, with the injection locked oscillator being a differential cross-pair oscillator comprising a resonant circuit LC, of which a resonance frequency is close to $2f_c$, with an injection of the pre-conditioned signal being carried out in common mode, the frequency divider divides a frequency of the differential signal at an output of the injection locked oscillator by a factor 2.

12. The carrier recovery system according to claim 1, wherein the carrier regeneration circuit comprises an injection locked oscillator operating at the frequency $f_c$, with the oscillator locking in frequency and in phase on said non-modulated component at $Nf_c$ of the pre-conditioned signal and supplying a sinusoidal signal at the frequency $f_c$, in order to regenerate the carrier.

13. The carrier recovery system according to claim 12, wherein the frequency regeneration circuit comprises two quadrature differential cross-pair oscillators, that use resonant circuits LC, of which a resonance frequency is close to $f_c$, with quadrature oscillators injection locking in common mode, an injection in common mode being carried out by the pre-conditioning circuit, comprising a transistor polarised in such a way that its point of polarisation belongs to a non-linear portion of its characteristic drain-source current according to its gate-source voltage, said transistor receiving on its gate, through a connecting capacitor, the phase-modulated signal.

* * * * *